United States Patent [19]

Main

[11] Patent Number: 4,928,068

[45] Date of Patent: May 22, 1990

[54] FM DEMODULATOR

[75] Inventor: William E. Main, Mesa, Ariz.

[73] Assignee: Motorola Inc., Schaumburg, Ill.

[21] Appl. No.: 345,816

[22] Filed: May 1, 1989

[51] Int. Cl.$^5$ .............................................. H03D 3/00
[52] U.S. Cl. .................................... 329/324; 329/315
[58] Field of Search ............... 329/315, 323, 324, 327, 329/341; 328/140, 141; 307/510

[56] References Cited

U.S. PATENT DOCUMENTS 3,479,607  11/1969  Ruthroff ......................... 329/324 X

*Primary Examiner*—Davis Mis
*Attorney, Agent, or Firm*—Michael D. Bingham

[57] ABSTRACT

An FM demodulator circuit uses an oscillator to provide a switch control signal synchronized to an FM signal, and a current supply to provide differentially alternating currents at first and second outputs flowing through a commutator circuit to the first and second outputs of the FM demodulator circuit. The commutator circuit is responsive to the switch control signal for alternately switching the first and second outputs of the current supply between the first and second outputs of the FM demodulator circuit thereby providing an alternating current flowing in the first and second outputs of the FM demodulator circuit which has an average value over each half cycle of the switch control signal proportional to the deviation of the frequency of the FM signal from the free-running frequency of the oscillator.

20 Claims, 2 Drawing Sheets f>f₀

FM DEMODULATOR

BACKGROUND OF THE INVENTION

The present invention relates in general to demodulator circuits and, more particularly, to an FM (frequency modulation) demodulator circuit having an input responsive to an FM signal and first and second outputs in which an alternating current flows. The average value of the alternating current over each half cycle of the FM signal is proportional to the deviation of the FM signal.

Many applications, including home and car stereos and cellular telephones, utilize FM demodulators to recover the information encoded in the FM transmission. Prior FM demodulators have used multiplier circuits and quadrature phase shift networks to produce the demodulated output signal. Typically, the input of the FM demodulator is coupled to the input of the phase shift network which outputs a signal in quadrature with respect to the input signal. The input of the FM demodulator and the output of the phase shift network are coupled to the inputs of the multiplier circuit which provides an output signal proportional to the deviation of the frequency of the FM signal relative to the center frequency of the FM demodulator. Since the amplitude of the output signal of the multiplier is proportional to this deviation in frequency, the FM input signal has been converted to an amplitude modulated (AM) signal which can drive various output devices such as speakers.

A major problem associatd with the most, if not all, prior art arises from the use of the quadrature phase shift network and the multiplier circuit due to the harmonic distortion introduced into the demodulated output signal by these devices. Some FM demodulators employ complex feedback correction circuits to reduce the distortion by increasing the gain and linearity of the multipliers. These correction circuits have only a limited degree of success since it is very difficult to completely remove the harmonic distortion once it has been introduced into a circuit. In addition, the FM demodulator should be responsive to the instantaneous frequency of the FM signal independent of the amplitude variations of the FM signal (AM rejection). Most FM demodulators are sensitive to variations in the amplitude of the input FM signal.

Hence, there exists a need for a new approach to FM demodulation which eliminates the need for phase shit networks and complex feedback circuits. The new approach utilizes an oscillator circuit and a commutator circuit to produce an output signal wherein the average value of the output signal over each half cycle of the FM signal is proportional to the deviation of the operating frequency of the FM input signal from the free-running frequency of the oscillator.

SUMMARY OF THE INVENTION

It is therefore an object of the present invention to provide an improved an FM demodulator circuit.

Another objective of the present invention is to provide an improved FM demodulator circuit having an alternating current flowing in first and second outputs wherein the average value of the alternating current over each half cycle of the FM signal is proportional to the deviation of the operating frequency of the FM input signal from a free-running frequency of the oscillator.

A further objective is to provide a FM demodulator which reduces the harmonic distortion introduced by phase shift networks.

Still a further objective is to provide a FM demodulator which is insensitive to amplitude variations in the FM input signal.

In accordance with the above and other objectives there is provided an FM demodulator circuit comprising an oscillator which is responsive to an FM signal for providing a switch control signal synchronized to the FM signal and a current supply for providing differentially alternating currents at first and second outputs also synchronized to the FM signal. A commutating circuit, coupled between the first and second outputs of the current supply and the first and second outputs of the FM demodulator circuit, is responsive to the switch control signal for alternately switching the first and second outputs of the current supply between the first and second outputs of the FM demodulator circuit thus providing an alternating current flowing in the first and second outputs of the FM demodulator circuit which has an average value over each half cycle of the switch control signal proportional to the deviation of the frequency of the FM signal from the free-running frequency of the oscillator.

DETAILED DESCRIPTION OF THE PREFERRED EMBODIMENT

Figure 1:
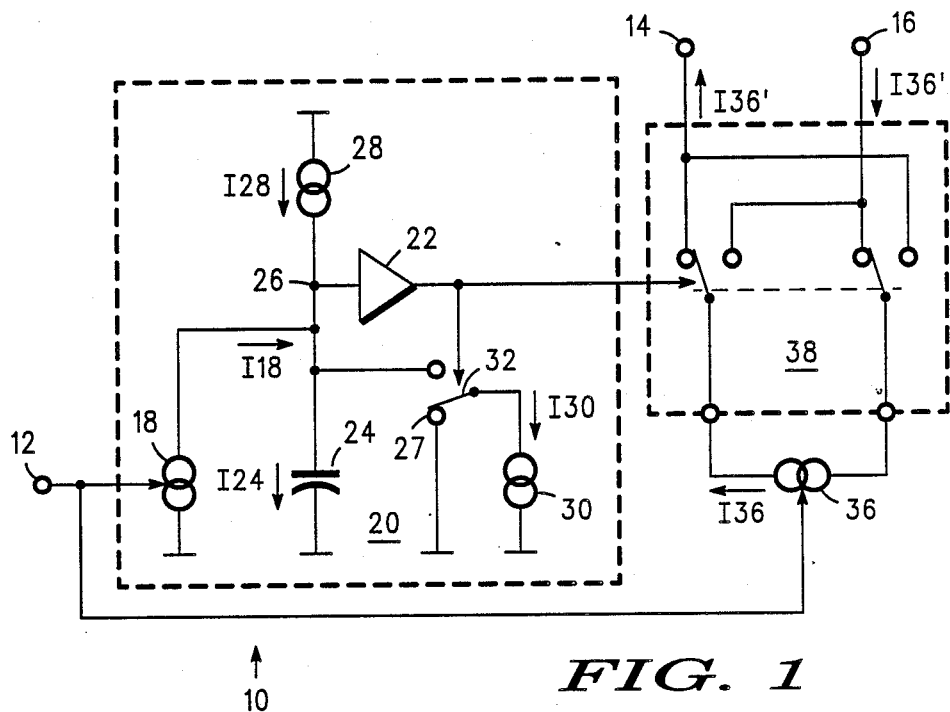
FIG. 1 is a simplified diagram illustrating the preferred embodiment of the present invention.

With reference to FIG. 1, FM demodulator circuit 10 may be realized as a monolithic integrated circuit using conventional integrated circuit processes. FM demodulator circuit 10 has input 12 and outputs 14 and 16. The FM signal is applied to input 12 which is coupled to the control input of current supply 18 for providing alternating current I18. The first output of current supply 18 is coupled to the input of oscillator circuit 20. A voltage, typially ground potential, is applied to the second output of current supply 18. Alternating current I18 is responsive to the FM signal and thus said to be synchronous with the operating frequency of the FM signal over a particular range of frequencies. The operating frequency is synonymous to the instantaneous frequency. The information content of the FM signal is obtained from the positive or negative values of the deviation of the operating frequency of the FM signal from the free-running frequency (defined later) of FM demodulator circuit 10. The deviation is the difference between the operating frequency and the free-running frequency. In typical applications, oscillator circuit 20 is tuned such that the free-running frequency is equal to the nominal center frequency of the FM signal.

Oscillator circuit 20 is an injection-locked, relaxation oscillator for providing a switch control signal at an output synchronized to the frequency of alternating current I18. The term injection-locked refers to the method of injecting current I18 which forces oscillator 20 to alter its operating frequency to equal that of current I18. Current supply 18 is coupled to the input of schmitt trigger 22 and to the first terminal of capacitor 24 at a node 26. A voltage, typically ground potential, is applied to the second terminal of capacitor 24. The current supply 28 is also coupled to capacitor 24 at node 26 for providing current I28 of amplitude I1. The current supply 30 is alternately coupled to nodes 26 and 27 through switch 32 which is responsive to the switch control signal. A voltage, typically ground potential, is applied to the output of current supply 30.

The first and second outputs of current supply 36 are coupled to the first and second innputs of commutator circuit 38 for providing alternating current I36. Current supply 36 also includes a control input which is responsive to the FM signal for synchronizing alternating current I36 to the FM signal. Commutator circuit 38 includes a switch control input and first and second outputs which are coupled to the outputs 14 and 16 of FM demodulator circuit 10 respectively. The output of oscillator circuit 20 is coupled to the switch control input of commutator circuit 38 which is responsive to the switch control signal for alternately coupling the first and second outputs of current supply 36 to outputs 14 and 16 respectively during one half cycle of the switch control signal, and the first and second inputs to outputs 16 and 14 respectively during the other half cycle.

To define the free-running frequency, current supply 18 is momentarily disabled. The hysteresis of schmitt trigger 22 causes the output to change state when the input reaches a first threshold voltage and maintain that state until the input voltage reaches a second threshold voltage. The output of schmitt trigger 22 then switches to the opposite state, maintaining the opposite state until the cycle repeats. Beginning with the input of current supply 30 coupled to node 27, current I28 having constant amplitude I1 charges capacitor 24 which increases the voltage at node 26 to the upper threshold of schmitt trigger 22 which causes the output of schmitt trigger 22 to change state thereby coupling the input of current supply 30 to node 26 through switch 32. The capacity of current supply 30 is two times I1 enabling it to sink current I28 and additionally discharge capacitor 24, thereby reducing the voltage at the input of schmitt trigger 22 to the lower threshold causing schmitt trigger 22 to change state again coupling the input of current supply 30 to node 27. This cycle repeats at a free-running frequency independent of the FM input signal as determined by currents I28 and I30 as well as the value of capacitor 24 and the upper and lower thresholds of schmitt trigger 22.

Figure 2A:
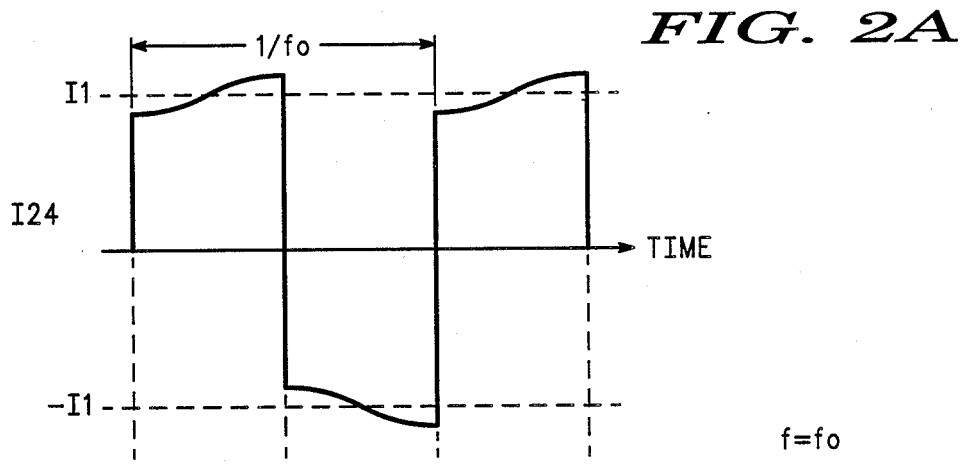
FIGS. 2A and 2B are plots of the waveform of particular currents of FIG. 1 operating at the free-running frequency of the oscillator.

Re-enabling current supply 18, the operation of FM demodulator circuit 10 is considered under the initial condition that the operating frequency of the FM signal is equal to the free-running frequency of oscillator circuit 20. As shown in FIG. 2a, the waveform of current I24 includes constant current I28 having amplitude I1 and alternating current I18 symmetrical about the value I1 to charge and discharge capacitor 24. Sine the operating frequency of the FM signal (f) is equal to the free-running frequency of the oscillator circuit 20 (fo), the "I1" cross-over point of the waveform occurs at the center of the half cycle. If the "I1" cross-over point did not occur at the center, there would be a net positive or negative contribution from current I18 causing a corresponding higher or lower rate of charge and discharge to capacitor 24 and, accordingly, a higher or lower operating frequency of oscillator circuit 20. The net contribution of current I18 over the half cycle must be zero otherwise the operating frequency would not equal the free-running frequency as set forth in the initial condition.

Figure 2B:
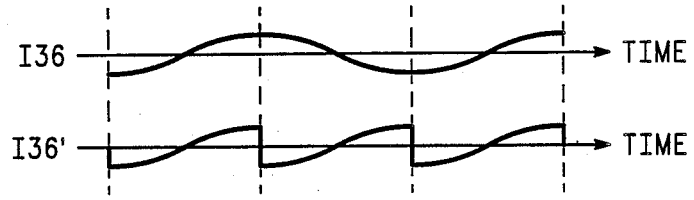

Continuing with FIG. 1, current supply 36 provides alternating current I36 which is also synchronized to the FM signal. Commutator circuit 38, which is responsive to the switch control signal, switches the polarity of current I36 at the transition points of the switch control signal causing current I36' to flow in outputs 14 and 16, as illustrated in FIG. 2b. The waveform of current I36', which differs from the waveform of current I36 due to the switching action of commutator circuit 38, has an average value of zero over the half cycle of the waveform. The deviation is defined to be zero, as set forth in the initial condition, which checks with the average value of current I36'.

Figure 3A:
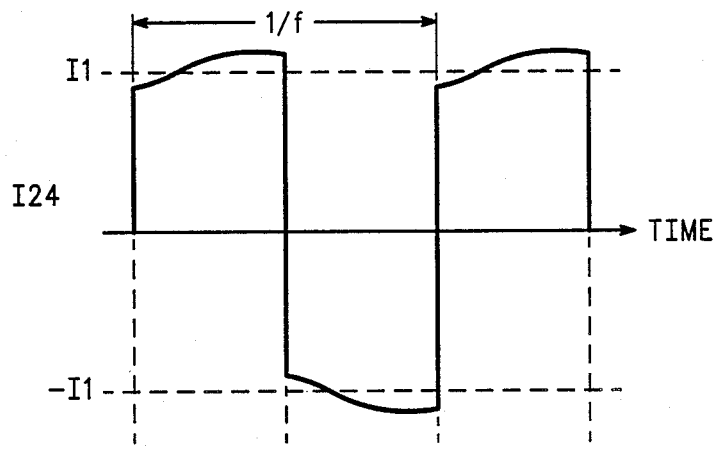
FIGS. 3A and 3B are plots of the waveform of particular currents of FIG. 1 operating at a frequency greater than the free-running frequency.
Figure 3B:
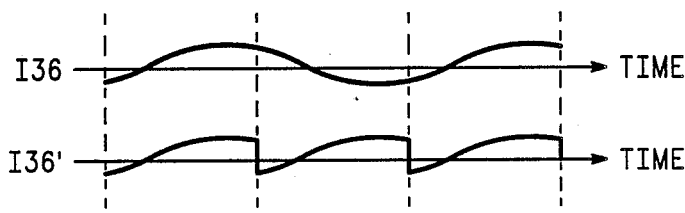

The operation of FM demodulator circuit 10 is now considered under the modified condition that the operating frequency of the FM signal is greater than the free-running frequency which aserts a positive deviation. Again, beginning with current supply 30 coupled to node 27, a combination of current I28 and alternating current I18 charges and discharges capacitor 24. The greater operating frequency of alternating current I18 causes a shorter period for the switch control signal relative to the period of the free-running frequency. The "I1" cross-over point occurs sooner in time due to the shorter period which has the effect of introducing a phase lead into current I24, as shown in FIG. 3a. The phase lead causes a net positive contribution from current I18 in the average amplitude of current I24 over the half cycle. This increases the charge and discharge rate of capacitor 24 and, accordingly, the rate at which the voltage at node 26 transitions between the upper and lower thresholds of schmitt trigger 22. Thus, the frequency of oscillator circuit 20 increases to a value equal to the frequency of current 18 which is also equal to the operating frequency of the FM input signal. Recall that the operating frequency of commutator circuit 38 and alternating current supply 36 are also synchronized to the FM signal. As illutrated in FIG. 3b, commutator circuit 36 switches the polarity of current I36 at the faster operating frequency noted above, producing the waveform of current I36' as shown inn FIG. 3b. The increase in the operating frequency of the FM input signal produces a positive average value in current I36' over the half cycle. The average value is proportional to deviation of the instantaneous frequency of the FM signal as set forth in the modified condition. A negative deviation from the operating frequency would follow a similar discussion.

Figure 4:
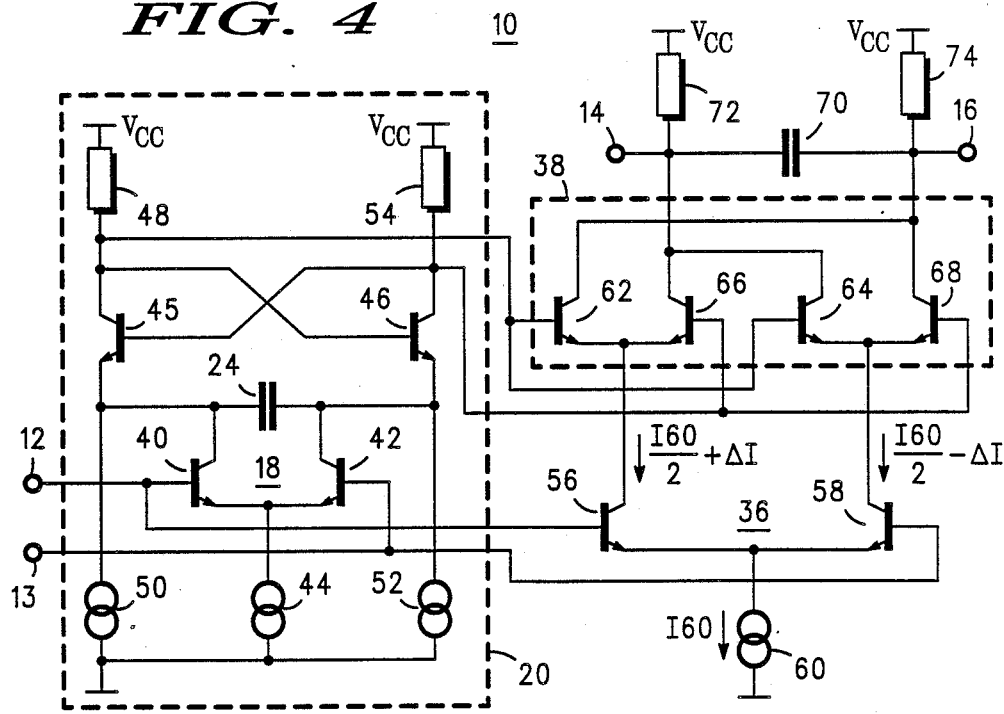
FIG. 4 is a more detailed schematic diagram of the preferred embodiment of FIG. 1.

The schematic diagram of FIG. 4 illustrates a more detailed embodiment of FIG. 1. Similar components are given the same reference numbers used in FIG. 1. The free-running operation of oscillator circuit 20 which comprises a well known emitter-coupled multivibrator is first discussed by momentarily disabling current supply 18 which comprises transistors 40 and 42 and current supply 44. The first and second terminals of capacitor 24 are coupled to the emitters of transistors 45 and 46 respectively. Assuming that transistor 45 is initially turned on and that the voltage at the second terminal of capacitor 24 is more positive than the voltage at the first terminal, a first current flows through resistor 48 and transistor 45. A voltage is developed at the collector of transistor 45, and thus the base of transistor 46, which is equal to the supply voltage, $V_{CC}$, less the potential developed across resistor 48 due to the first current. The magnitude of the positive voltage at the second terminal of capacitor 24 is sufficient to unbias the base-emitter junction of transistor 46. The voltage at base of transistor 45 is maintained substantially equal to $v_{CC}$ since negligible current is flowing in resistor 54. Since transistor 46 turned off, the current flowing through capacitor 24 into current supply 52 will discharge the second terminal of capacitor 24 thereby reducing the voltage at the emitter of transistor 46 until the base-emitter junction of transistor 46 becomes forward biased. As transistor 46 turns on, a second current flows through resistor 54 and transistor 46. The voltage at the base of transistor 45 is reduced due to the potential developed across resistor 54 from the second current which is sufficient to unbias the base-emitter junction and turn off transistor 45. The current flowing into current supply 50 then discharges the first terminal of capacitor 24 thus reducing the voltage at the emitter of transistor 45 until the base-emitter junction of transistor 45 becomes forward biased which turns off transistor 46. This cycle repeats at the free-running frequency. Reenabling current supply 18, the differential FM signal applied at inputs 12 and 13 alternately turns on transistors 40 and 42 providing an additional charge and discharge current to the first and second terminals of capacitor 24 at the frequency of the FM signal, thus synchronizing the frequency of oscillator 20 to the FM signal.

The first and second switch control signals applied to commutator circuit 38 are provided at the collectors of transistor 45 and 46. Controlled current supply 36 is realized by a pair of differentially coupled transistors 56 and 58 and current supply 60. The bases of differrential transistors 56 and 58 are coupled to differential inputs 12 and 13 respectively, and current supply 60 is coupled to the emitters of transistors 56 and 58. Assuming identical transistors 56 and 58, the differential FM signal applied to the bases of transistor 56 and 58 will cause a current of amplitude $I60/2 \pm \Delta I$ to flow in the collector-emitter conduction paths of these transistors. The alternating component of amplitude, $\pm \Delta I$, is the aforedescribed current I36 operating at a frequency synchronized the FM input signal. The first switch control signal is coupled to the bases of transistors 62 and 64, and the second switch control signal is coupled to the bases of transistors 66 and 68. The first and second switch control signals alternately turn on transistors 62 and 64 during one half cycle, and transistors 66 and 68 during the other half cycle of oscillator circuit 20. Capacitor 70 performs the averaging of the alternating current to provide a value proportional to the deviation of the frequency of the FM signal from the free-running frequency of the oscillator. Resistors 72 and 74 provide a means to develop voltages at outputs 14 and 16 respectively proportional to the currents flowing in the outputs. The waveforms of the voltages at outputs 14 and 16, less the direct current component I60, are identical to those shown in FIGS. 2 and 3.

What has been provided therefore is a novel FM demodulator circuit providing an alternating current flowing in the first and second outputs wherein the average value of the alternating current over each half cycle of the FM signal is proportional to the deviation of the FM signal. In addition, the present invention provides a means to demodulate the FM signal without the use of phase shift networks or complex feedback circuits thereby avoiding the harmonics distortion introduced by these devices. While there have been described above the principles of the invention in conjunction with a specific apparatus, it is clearly understood that this description is made only by way of example and is not a limitation to the scope of the invention.

I claim:

1. An FM demodulator circuit having first and second outputs and which receives an FM signal, comprising:

oscillator means which is responsive to the FM signal for providing a switch control signal synchronized to the FM signal, said oscillator means operating at a free-running frequency when the FM signal is disabled;

circuit means response to the FM signal for providing alternating currents synchronized to the FM signal at first and second outputs; and commutating means coupled between first and second outputs of the FM demodulator circuit and said first and second outputs of said circuit means, said commutating means being responsive to said switch control signal for alternately switching said first and second outputs of said circuit means between said first and second outputs of the FM demodulator circuit, wherein the average value of said alternating current flowing in the first and second outputs of the FM demodulator circuit over each half cycle of said switch control signal is proportional to the deviation of the frequency of the FM signal from said free-running frequency of said oscillator means.

2. The FM demodulator circuit of claim 1 wherein said commutating means comprises:

first and second control inputs for receiving said switch control signal wherein said switch control signal is a balanced differential switch control signal; and first switching means being responsive to said switch control signal and having first, second and third terminals, said first terminal being coupled to said first output of said circuit means, said second and third terminals being coupled to said second and first outputs of the FM demodulator circuit respectively, said first terminal being coupled to said second terminal when said switch control signal has a first polarity, said first terminal being coupled to said third terminal when said switch control signal has a second polarity.

3. The FM demodulator circuit of claim 2 wherein said commutating circuit further comprises second switching means being responsive to said switch control signal and having first, second and third terminals, said first terminal being coupled to said second output of said circuit means, said second and third terminals being coupled to said first and second outputs of the FM demodulator circuit respectively, said first terminal being coupled to said second terminal when said switch control signal has said first polarity, said first terminal being coupled to said third terminal when said switch control signal has said second polarity.

4. The FM demodulator circuit of claim 3 wherein said first switching means comprises:

a first transistor having a base, an emitter and a collector, said base being coupled to said first control input of said commutating means, said collector being coupled to said second terminal of said first switching means, said emitter being coupled to said first terminal of said first switching means; and a second transistor having a base, an emitter and a collector, said base being coupled to said second control input of said commutating means said collector being coupled to said third terminal of said first switching means, said emitter being coupled to said first terminal of said first switching means.

5. The FM demodulator circuit of claim 4 wherein said second switching means comprises:

a third transistor having a base, an emitter and a collector, said base being coupled to said first control input of said commutating means, said collector being coupled to said second terminal of said second switching means, said emitter being coupled to said first terminal of said second switching means; and a fourth transistor having a base, an emitter and a collector, said base being coupled to said second control input of said commutating means, said collector being coupled to said third terminal of said second switching means, said emitter being coupled to said first terminal of said second switching means.

6. The FM demodulator circuit of claim 5 wherein the FM demodulator further includes a capacitor coupled between the first and second outputs for providing a means to average said alternating current flowing therein.

7. The FM demodulator circuit of claim 6 wherein said circuit means comprises:

first and second control inputs for receiving the FM signal wherein the FM signal is a balanced differential FM signal;

a fifth transistor having a base, an emitter and a collector, said base being coupled to said first control input of said circuit means, said collector being coupled to said first output of said circuit means; and a sixth transistor having a base, an emitter and a collector, said base being coupled to said second control input of said circuit means, said collector being coupled to said second output of said circuit means, said emitter of said fifth transistor being coupled to said emitter of said sixth transistor.

8. The FM demodulator circuit of claim 7 wherein said circuit means further comprises first current supply means coupled to said emitters of said fifth and sixth transistors for providing a substantially constant current.

9. The FM demodulator circuit of claim 8 wherein said oscillator means comprises:

first and second resistors each having first and second terminals, said first terminals of said first and second resistors being coupled to a terminal which has a voltage applied thereto;

seventh and eighth transistors each having a base, an emitter and a collector, said collectors of said seventh and eighth transistors being coupled to said second terminals of said first and second resistors respectively for providing said balanced differential switch control signal, said base of said seventh transistor being coupled to said collector of said eighth transistor, said base of said eighth transistor being coupled to said collector of said seventh transistor;

a capacitor coupled between said emitters of said seventh and eighth transistors; and second current supply means having first and second outputs which are coupled to said emitters of said seventh and eighth transistors respectively.

10. The FM demodulator circuit of claim 9 wherein said oscillator means further includes:

first and second control inputs for receiving said balanced differential FM signal;

ninth and tenth transistors each having a base, an emitter and a collector, said emitters being coupled together, said collectors of said ninth and tenth transistors being coupled to said emitters of said seventh and eighth transistors respectively, said bases of said ninth and tenth transistors being coupled to said first and second control inputs of said oscillator means respectively; and third current supply means which is coupled to said emitters of said ninth and tenth transistors.

11. An integrated FM demodulator circuit having first and second outputs and which receives an FM signal, comprising:

oscillator means which is responsive to the FM signal for providing a switch control signal synchronized to the FM signal, said oscillator means operating at a free-running frequency when the FM signal is disabled;

circuit means responsive to the FM signal for providing alternating currents synchronized to the FM signal at first and second outputs; and commutating means coupled between first and second outputs of the FM demodulator circuit and said first and second outputs of said circuit means, said commutating means being responsive to said switch control signal for alternately switching said first and second outputs of said circuit means between said first and second outputs of the FM demodulator circuit, wherein the average value of said alternating curent flowing in the first and second outputs of the FM demodulator circuit over each half cycle of said switch control signal is proportional to the deviation of the frequency of the FM signal from said free-running frequency of said oscillator means.

12. The FM demodulator circuit of claim 11 wherein said commutating means comprises:

first and second control inputs for receiving said switch control signal wherein said switch control signal is balanced differential switch control signal; and first switching means being responsive to said switch control signal and having first, second and third terminals, said first terminal being coupled to said first output of said circuit means, said second and third terminals being coupled to said second and first outputs of the FM demodulator circuit respectively, said first terminal being coupled to said second terminal when said switch control signal has a first polarity, said first terminal being coupled to said third terminal when said switch control signal has a second polarity.

13. The FM demodulator circuit of claim 12 wherein said commutating circuit further comprises second switching means being responsive to said switch control signal and having first, second and third terminals, said first terminal being coupled to said second output of said circuit means, said second and third terminals being coupled to said first and second outputs of the FM demodulator circuit respectively, said first terminal being coupled to said second terminal when said switch control signal has said first polarity, said first terminal being coupled to said third terminal when said switch control signal has said second polarity.

14. The FM demodulator circuit of claim 13 wherein said first switching means comprises:
- a first transistor having a base, an emitter and a collector, said base being coupled to said first control input of said commutating means, said collector being coupled to said second terminal of said first switching means, said emitter being coupled to said first terminal of said first switching means; and
- a second transistor having a base, an emitter and a collector, said base being coupled to said second control input of said commutating means, said collector being coupled to said third terminal of said first switching means, said emitter being coupled to said first terminal of said first switching means.

15. The FM demodulator circuit of claim 14 wherein said second switching means comprises:
- a third transistor having a base, an emitter and a collector, said base being coupled to said first control input of said commutating means, said collector being coupled to said second terminal of said second switching means, said emitter being coupled to said first terminal of said second switching means; and
- a fourth transistor having a base, an emitter and a collector, said base being coupled to said second control input of said commutating means, said collector being coupled to said third terminal of said second switching means, said emitter being coupled to said first terminal of said second switching means.

16. The FM demodulator circuit of claim 15 wherein the FM demodulator further includes a capacitor coupled between the first and second outputs for providing a means to average said alternating current flowing therein.

17. The FM demodulator circuit of claim 16 wherein said circuit means comprises:
- first and second control inputs for receiving the FM signal wherein the FM signal is a balanced differential FM signal;
- a fifth transistor having a base, an emitter and a collector, said base being coupled to said first control input of said circuit means, said collector being coupled to said first output of said circuit means; and
- a sixth transistor having a base, an emitter and a collector, said base being coupled to said second control input of said circuit means, said collector being coupled to said second output of said circuit means, said emitter of said fifth transistor being coupled to said emitter of said sixth transistor.

18. The FM demodulator circuit of claim 17 wherein said circuit means further comprises first current supply means coupled to said emitters of said fifth and sixth transistors for providing a substantially constant current.

19. The FM demodulator circuit of claim 18 wherein said oscillator means comprises:
- first and second resistors each having first and second terminals, said first terminals of said first and second resistors being coupled to a terminal which has a voltage applied thereto;
- seventh and eighth transistors each having a base, an emitter and a collector, said collectors of said seventh and eighth transistors being coupled to said second terminals of said first and second resistors respectively for providing said balanced differential switch control signal, said base of said seventh transistor being coupled to said collector of said eighth transistor, said base of said eighth transistor being coupled to said collector of said seventh transistor;
- a capacitor coupled between said emitters of said seventh and eighth transistors; and
- second current supply means having first and second outputs which are coupled to said emitters of said seventh and eight transistors respectively.

20. The FM demodulator circuit of claim 19 wherein said oscillator means further includes:
- first and second control inputs for receiving said balanced differential FM signal;
- ninth and tenth transistors each having a base, an emitter and a collector, said emitters being coupled together, said collectors of said ninth and tenth transistors being coupled to said emitters of said seventh and eighth transistors respectively, said bases of said ninth and tenth transistors being coupled to said first and second control inputs of said oscillator means respectively; and
- third current supply means which is coupled to said emitters of said ninth and tenth transistors.

* * * * *

UNITED STATES PATENT AND TRADEMARK OFFICE
CERTIFICATE OF CORRECTION

PATENT NO. : 4,928,068

DATED : May 22, 1990

INVENTOR(S) : William E. Main

It is certified that error appears in the above-identified patent and that said Letters Patent is hereby corrected as shown below:

Column 1, line 51, delete "shit" and insert therefor --shift--.

Signed and Sealed this

Third Day of December, 1991

Attest:

HARRY F. MANBECK, JR.

*Attesting Officer*     Commissioner of Patents and Trademarks